United States Patent [19]
Jones

[11] Patent Number: 6,151,560
[45] Date of Patent: Nov. 21, 2000

[54] OPEN CIRCUIT FAILURE MONITORING APPARATUS FOR CONTROLLED ELECTRICAL RESISTANCE HEATERS

[76] Inventor: Thaddeus M. Jones, 1302 High St., South Bend, Ind. 46601

[21] Appl. No.: 09/037,410

[22] Filed: Mar. 10, 1998

Related U.S. Application Data

[63] Continuation-in-part of application No. 08/410,916, Mar. 27, 1995, abandoned.

[51] Int. Cl.[7] .............................. G01R 31/00; H02H 7/00
[52] U.S. Cl. .................................. 702/58; 702/64; 702/65; 361/7; 361/15; 315/240; 324/550; 324/556
[58] Field of Search .................................. 702/57, 58, 60, 702/61, 64–65; 315/240, 241 R, 245; 361/5, 6, 7, 15; 341/118; 324/500, 509, 556, 522, 555

[56] References Cited

U.S. PATENT DOCUMENTS

| | | | |
|---|---|---|---|
| 4,339,690 | 7/1982 | Regan et al. | 315/240 |
| 4,572,991 | 2/1986 | Coté | 361/15 |
| 4,799,019 | 1/1989 | Cooley et al. | 324/556 |
| 5,252,894 | 10/1993 | Bank et al. | 315/307 |
| 5,448,491 | 9/1995 | Janke et al. | 702/58 |
| 5,514,964 | 5/1996 | Benesh et al. | 324/509 |
| 5,861,740 | 1/1999 | So | 324/74 |

*Primary Examiner*—Marc S. Hoff
*Assistant Examiner*—Bryan Bui
*Attorney, Agent, or Firm*—R. Tracy Crump

[57] ABSTRACT

An open circuit failure monitoring apparatus for controlled electrical resistance heaters is disclosed. The heater failure monitoring apparatus allows controlled electrical resistance heaters to be continuously monitored for open circuit failures without applying an operational current flow through the heater, regardless of the operational status of the heater and without significant power consumption during periods when the heater is not operated. The failure monitoring apparatus includes a reactive current limiting element, such as a capacitor, and a current monitoring circuit. The capacitor is connected in parallel with the contact switch used to control line voltage applied to the resistive load. The reactance of the capacitor provides a small but continuous test current capable of being detected by the current sensing component, but not large enough to consume significant power. Current monitoring circuit includes a current to voltage (i/V) converter, an analog to digital (A/D) converter, a microprocessor, electrically erasable programmable read only memory (EEPROM), and an alarm circuit. The current monitoring circuit uses a microprocessor to continuously compare sampled test voltage values to reference voltage values stored in the EEPROM that have been prerecorded for both an active and inactive heater during normal operation (non-failure) conditions so as to determine the presence of a failure condition in the controlled heater.

10 Claims, 4 Drawing Sheets

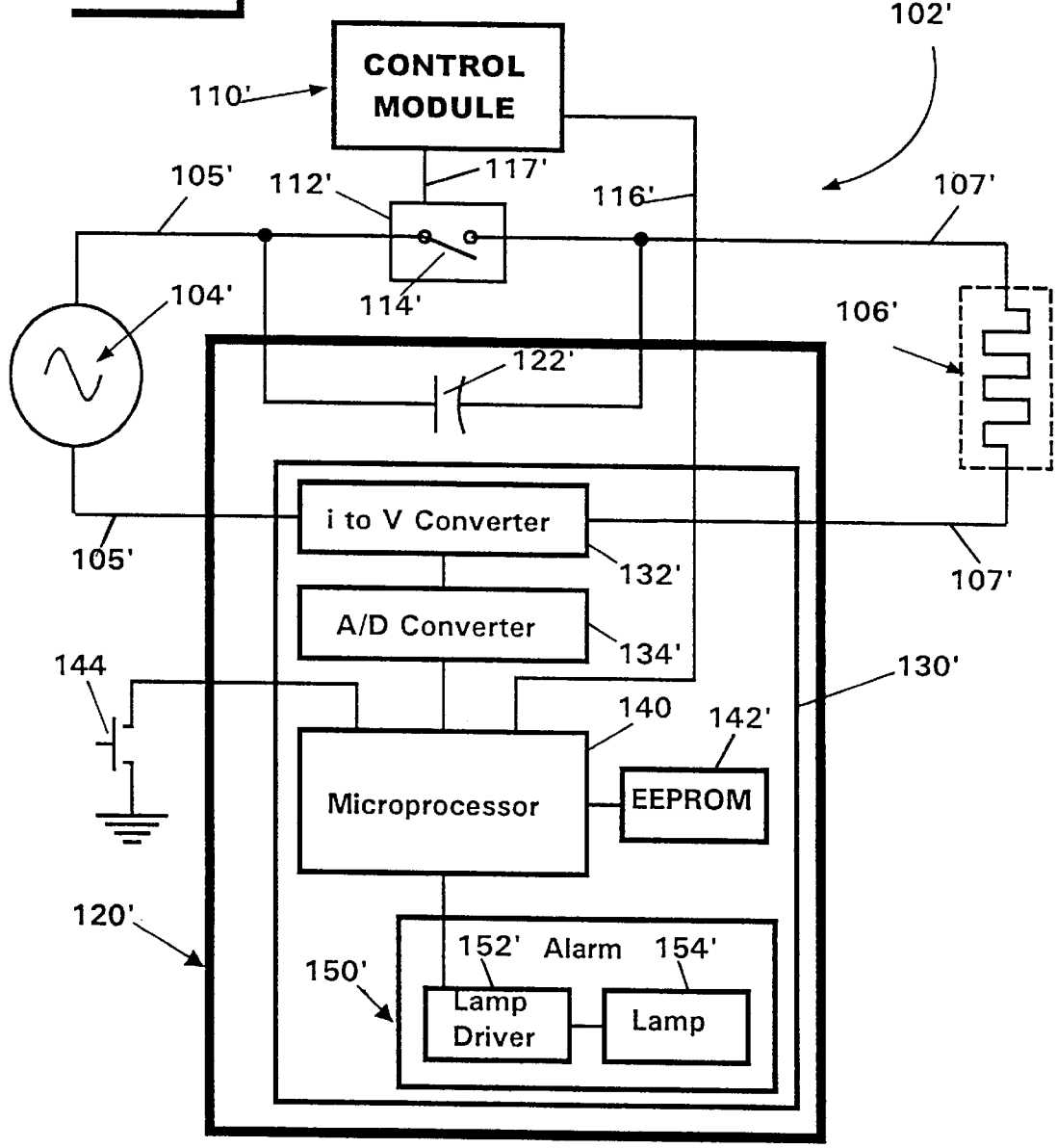

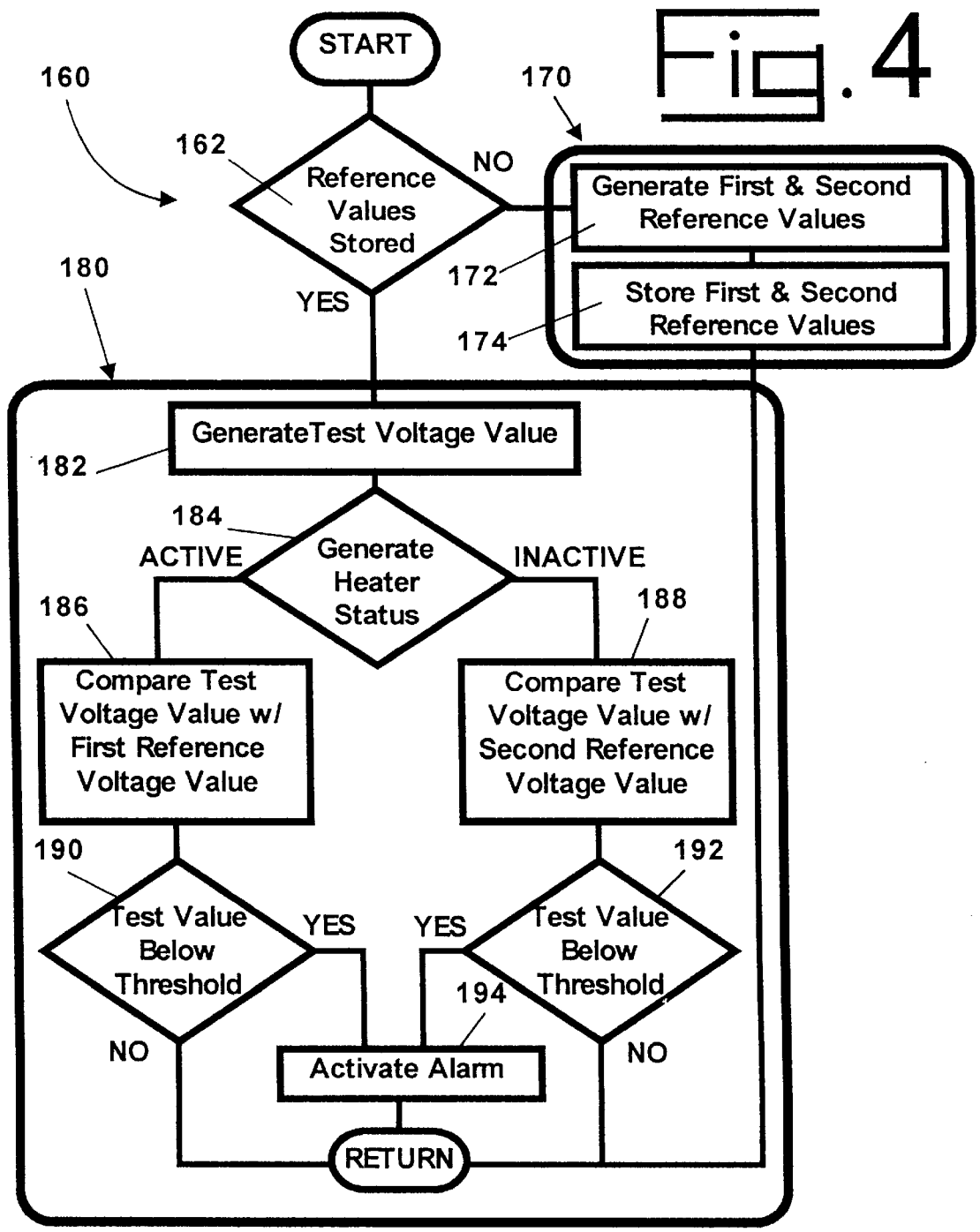

OPEN CIRCUIT FAILURE MONITORING APPARATUS FOR CONTROLLED ELECTRICAL RESISTANCE HEATERS

This is a continuation-in-part application of copending application Ser. No. 08/410,916 filed on Mar. 27, 1995 now abandoned.

This invention relates to an electrical circuit used in a control system for continuously monitoring a controlled resistive load for open circuit failures.

BACKGROUND OF THE INVENTION

The reliable operation of controlled resistive loads is critical to many control system applications, particularly in temperature control systems using resistance heating. For example, the failure of resistance heating cables used for freeze protection in a wet sprinkler system can result in collateral water damage due to frozen water pipes, as well as, in the failure of the sprinkler system to function when needed. In many applications, such resistance heaters can be inactive for extended periods of time. Consequently, heater failures must be discovered before operation of the heater is required. Generally in control system topology, a resistance heater or other resistive load is connected to a line voltage power source through an electric controller, which controls the line voltage applied to the load. The controller opens and closes the contact switch to operate the heater or load as needed.

Electrical controllers have been developed which include monitoring circuits for detecting open circuit failures in resistive loads while the loads are under power. Generally, the failure detection circuits in the controllers test a load by monitoring an actual operational current flow through the resistive load. Consequently, the loads must be periodically operated during idle conditions to verify the load's integrity. When viewed over an extended period of time, the periodic integrity testing of a load during its idle conditions consumes a significant amount of power, which translates into increased operational cost of the system. Again, this fact is particularly true for temperature control systems which use resistance heating.

SUMMARY OF THE INVENTION

An open circuit failure monitoring apparatus of this invention allows controlled electrical resistance heaters to be continuously monitored for open circuit failures without applying an operational current flow through the load is disclosed, regardless of the operational status of the load and without significant power consumption during periods when the load is not operated. The heater failure monitoring apparatus of this invention may be used in any typical controlled resistance heater application, which includes a contact switch used to selectively apply an operational current flow through the heater or a resistive load. The contact switch can be operated manually or in response to an electrical thermostat controller. The heater failure monitoring apparatus of this invention can be wired as a single integrated monitoring module or as individual circuit components separate from the controller or incorporated directly into the circuitry of a conventional electrical controller.

The heater failure monitoring apparatus includes a reactive current limiting element, such as a capacitor and an ammeter or current monitoring circuit. The capacitor is connected in parallel with the contact switch used to control line voltage applied to the resistive load. The reactance of the capacitor provides a small but continuous test current capable of being detected by the ammeter or current sensing component, but not large enough to consume significant power. Current monitoring circuit includes a current to voltage (i/V) converter, an analog to digital (A/D) converter, a microprocessor, electrically erasable programmable read only memory (EEPROM), and an alarm circuit. The current monitoring circuit uses a microprocessor to continuously compare sampled test voltage values to reference voltage values stored in the EEPROM that have been prerecorded for both an active and inactive heater during normal operation (non-failure) conditions so as to determine the presence of a failure condition in the controlled heater.

The monitoring circuit of this invention is particularly applicable to temperature control systems that use resistance heating. Consequently, the monitoring circuit of this invention is described herein, for illustrative purposes only, as part of such a conventional temperature control system, but it may be employed in a variety of other controlled resistive load applications.

Accordingly, an advantage of this invention is that the failure monitoring apparatus continuously monitors a controlled resistive load for open circuit failures without applying an operational current flow through the load and without significant power consumption during periods when the load is not operational.

Another advantage of this invention is that the heater failure monitoring apparatus continuously monitors the heater for failure conditions by comparing current flow through the heater to two electronically stored reference values corresponding to the current flow through the heater during normal (non-failure condition) operations when both active and inactive.

Other advantages will become apparent upon a reading of the following description.

BRIEF DESCRIPTION OF THE DRAWINGS

A preferred embodiment of the invention has been depicted for illustrative purposes only, wherein:

FIG. 3 is a schematic drawing of a third embodiment of the heater failure monitoring apparatus of this invention;

FIG. 4 is a flow chart of the software program which controls the operation of the heater failure monitoring apparatus of this invention.

DESCRIPTION OF THE PREFERRED EMBODIMENT

The preferred embodiment herein described is not intended to be exhaustive or to limit the invention to the precise form disclosed. Rather, it is chosen and described to best explain the invention so that others skilled in the art might utilize its teachings.

Three different embodiments of the heater failure monitoring apparatus of this invention are shown in the figures and described herein. Each embodiment of the monitoring apparatus is used in a typical electrically controlled resistance heater system 2, such as constant resistance or self-limiting heating cable. While the heater monitoring apparatus of this invention are herein described as part of an electrically controlled resistance heater system, their teachings are applicable to any application which controls the operation of a resistive load, and is not intended to limit the scope of this invention.

Figure 1:
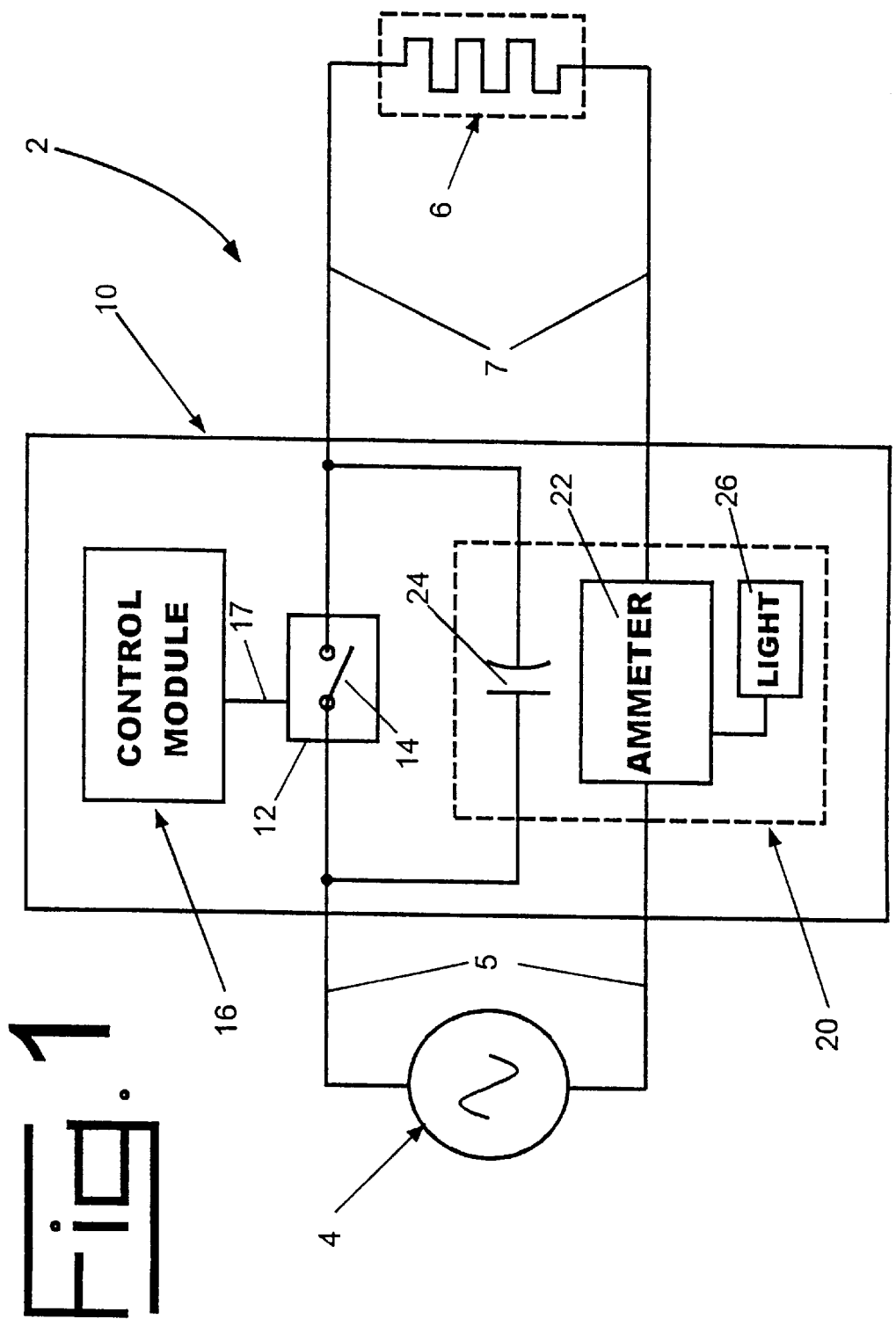
FIG. 1 is a schematic drawing of one embodiment of the heater failure monitoring apparatus of this invention.

FIG. 1 shows the first embodiment of the heater monitoring apparatus of this invention. Heater systems 2 includes an external line voltage source 4, a resistance heater load 6, such as constant resistance or self-limiting heating cable, an electrical thermostat controller 10 and a contactor or relay 12. The circuit of thermostat controller 10 is of a conventional design and is well known in the field. Thermostat controller 10 is connected between line voltage source 4 and heating unit 6 by wire pairs 5 and 7. Thermostat controller 10 includes a thermostatic control module (thermostat module) 16 and a contactor or relay 12 responsive to the thermostat module for controlling the operation of load 6. Relay 12 is connected to thermostat controller 10 by control line 17 and includes a single pole, single throw contact switch 14. Contact switch 14 opens and closes to apply line voltage from voltage source 4 to heater 6 in response to the control signal from control module 16 on control line 17.

As shown in FIG. 1, the monitoring apparatus 20 is incorporated directly into the circuitry of controller 10; however, the monitoring circuit can be wired into the topology of control system 2 separate from the controller as a single integrated monitoring module or as separate individual circuit components. Monitoring apparatus 20 includes a current sensing component, such as a conventional ammeter circuit 22, and a current limiting element, preferably a capacitor 24. Capacitor 24 is connected in parallel with contact switch 14 between power source 4 and heating unit 6. Ammeter 22 is connected in series with heater 6 to sense and measure the current flow through heater 6. While contact switch 14 is open, the reactance of capacitor 24 provides a small but continuous test current flow capable of being read by ammeter 22, but not large enough to consume significant power when applied across heater 6. If heater 6 is functioning properly (i.e. a closed circuit condition), ammeter 22 reads the test current when contact switch 14 is open and the operational current when the contact switch is closed. The failure of ammeter 22 to sense a current flow indicates an open circuit failure condition in heater 6. Monitoring module 20 may also employ a meter relay device (not shown) responsive to ammeter 22 or other current sensing components, which activates a warning light or alarm 26 to alert a user of the failure condition in heater 6. While contact switch 14 is open, the reactance of capacitor 24 provides a small but continuous test current flow capable of being read by ammeter 22, but not large enough to consume significant power when applied across load 6. If load 6 is functioning properly (i.e. a closed circuit condition), ammeter 22 reads the test current when contact switch 14 is open and the operational current when the contact switch is closed. The failure of ammeter 22 to sense a current flow indicates an open circuit failure condition in load 6. Monitoring module 20 may also employ a meter relay device (not shown) responsive to ammeter 22 or other current sensing components, which activates a warning light or alarm 26 to alert a user of the failure condition in heater 6.

A capacitor is selected as the current limiting element for various practical reasons, even though inductors, current limiting resistors and a variety of other electrical components and circuits can be employed to provide a functionally equivalent purpose. The inherent reactance of a capacitor provides a continuous test current without sacrificing power consumption. The capacitor is selected to have a reactance, which is much greater than the resistance of the controlled heater load, and which is approximately in quadrature with the phase angle of the excitation voltage from the power source. Since the phase angle between the test current and the excitation voltage is nearly 90°, the power consumed while the test current is applied through the resistive load is negligible.

Figure 2:
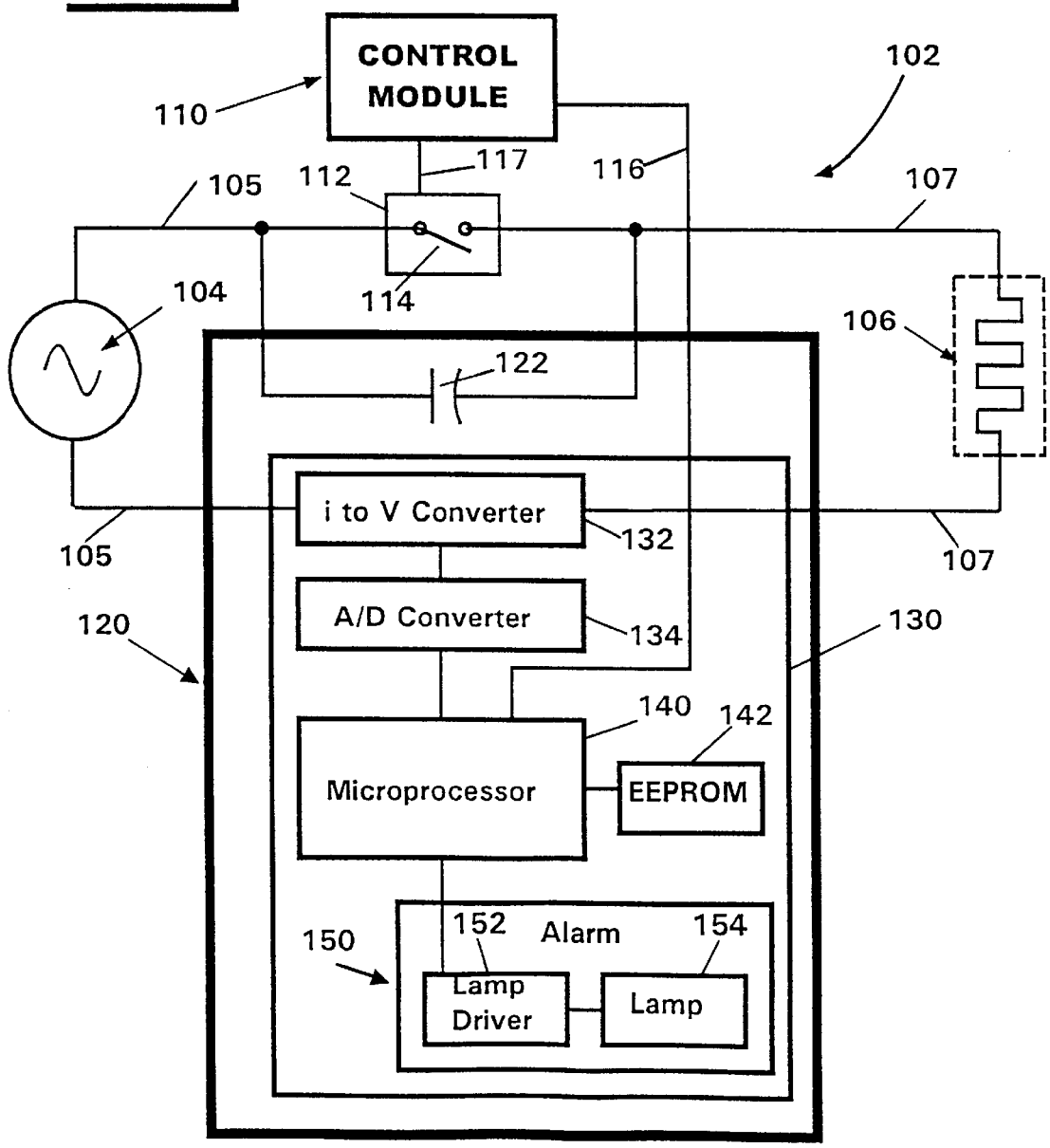
FIG. 2 is a schematic drawing of a second embodiment of the heater failure monitoring apparatus of this invention.

FIG. 2 shows a second embodiment of heater monitoring apparatus 120, which is wired into the heating system 102, as a separate component. While heater monitoring apparatus 120 is shown in the figures as a separate component or module wired into the heater systems, the apparatus may be incorporated directly into the electrical circuitry of the thermostat control, which controls the operation of the heaters.

Again, heater system 102 includes an external line voltage source 104, a resistance heater 106, such as constant resistance or self-limiting heating cable, an electrical thermostat controller 110 and a contactor or relay 112. The circuit of thermostat controller 110 is of conventional design and is well known in the field. Thermostat controller 110 is connected between line voltage source 104 and heater 106 by wire pairs 105 and 107. Thermostat controller 110 is connected to a contactor or relay 112 for controlling the operation of load 106. Relay 112 is connected to thermostat controller 110 by control line 17 and includes a single pole, single throw contact switch 114. Contact switch 114 opens and closes to apply line voltage from voltage source 104 to load 106 in response to the control signal from control module 110 on control line 117.

Heater monitoring apparatus 120 includes a current limiting element, preferably a capacitor 122, and a current monitoring circuit 130, which monitors the current flow through heater 106 to determine the presence of an open failure condition in the heater. Capacitor 122 is connected in parallel with contact switch 114 between power source 104 and heating unit 106. As in the first embodiment, while contact switch 114 is open, the reactance of capacitor 122 provides a small but continuous test current flow capable of being read by current monitoring circuit 130, but not large enough to consume significant power when applied to heater 106. Current monitoring component 130 is connected in series with heater 106 to monitor the current flow through heater 106.

Current monitoring circuit 130 includes a current to voltage (i/V) converter 132, an analog to digital (A/D) converter 134, a microprocessor 140, electrically erasable programmable read only memory (EEPROM) 142, and an alarm circuit 150. Preferably, microprocessor 140 has internal read-only memory (ROM), which is used to store the software program. Microprocessor 140 executes a software program 160 stored in its memory, which facilitates the monitoring of the current flow through heater 106 to signal a heater failure condition. FIG. 4 is a flow chart of the basic functions of the software program 160. While the function of the current monitoring component is accomplished using a microprocessor and digital technology, the function can also be accomplished using analog technology with equal effect, and should not be considered as a limitation to the scope of this invention.

The terminals of i/V converter 132 are connected in series with heater 6 and converts the current passing through heater 106 into a proportional analog voltage output signal. The output terminal of i/V converter 132 is connected to A/D converter 134. A/D converter 134 continuously samples the analog voltage output signal from i/V converter 132 and converts the sampled signal into a binary voltage value for use by microprocessor 140. The output from the A/D converter is connected to an input on the microprocessor 140. Another input of microprocessor 140 is connected to heater operation status line 116 from thermostat controller 110. Heater operation status line 116 provides an output signal, which tells the microprocessor whether or not the thermostat controller is operating heater 106. An output of microprocessor 140 is connected to EEPROM 142. EEPROM 142 is used to store two reference voltage values; one reference value defines the normal (non-failure condition) voltage value when heater 106 is operating, and another reference value defines the normal (non-failure condition) voltage value when heater 106 is not operating and capacitor 122 is providing a small but continuous test current flow through heater 106. Another output of microprocessor 140 is connected to alarm 150. Alarm circuit 150 includes a lamp driver 152 and a lamp 154, which are of conventional design and well known in the electrical arts. In the event of the heater failure, microprocessor 140 activates lamp driver 152 to illuminate lamp 154 and alert a user to the failure condition in the heater.

Upon the initial power up of heater system 2, two initial reference voltage values for heater systems during normal (non-failure conditions) are determined and stored in EPROM 142 for use in determining the presence of heater failure conditions. One reference voltage value is determined and stored for the current through heater 106 when the heater is active. The second reference voltage value is determined and stored in EEPROM 142, which corresponds to the current through heater 106 when the heater is inactive. These reference voltage values are compared to the continuous sampled test voltage values to determine heater failure conditions. The recording of the reference voltages can be performed as part of an initial start-up subroutine 170 of software program 160. As shown in FIG. 4, upon initial power up, software program 160 instructs the microprocessor to call the stored reference voltage values from EEPROM 142 (processor block 162). If either reference voltage values has not been stored in EEPROM 142, start-up subroutine 170 instructs microprocessor 140 to obtain the missing reference voltages (processor blocks 172 and 173) before beginning execution of the monitoring subroutine 180. Once the reference voltage values have been recorded in EEPROM 142, microprocessor 140 executes monitoring subroutine 180 in an infinite loop.

As shown in FIG. 3, monitoring subroutine 180 simply compares the sampled test voltage values to the reference voltage values to indicated whether a failure condition is present. First, monitoring subroutine 1 80 instructing microprocessor 140 to obtain a binary reading of the voltage signal from A-D converter 136 (process block 182). Next, monitoring subroutine instructs microprocessor 140 to determine whether thermostat controller 110 is operating the heaters (processor block 184). Microprocessor 140 stores the binary voltage value in a memory register. Next, monitoring subroutine 180 instructs microprocessor 140 to compare the sampled test voltage value stored in its memory register to the appropriate reference voltage value stored in the EEPROM 142 (process block 186 and 188).

If thermostat controller 110 is calling for heater operation, and the sampled test voltage value is below the first threshold parameter determined by the first reference voltage value (processor block 190), a failure condition is present and microprocessor 140 activates alarm 150 (processor block 194). If thermostat controller 110 is calling for heater operation, and the sampled test voltage value is above the first threshold parameter determined by the first reference voltage value (processor block 190), the heaters are operating normally. If thermostat controller 110 is not calling for heater operation, and the sampled test voltage value is below the second threshold parameter determined by the second reference voltage value (processor block 192), a failure condition is present and microprocessor 140 activates alarm 150 (processor block 194). If thermostat controller 110 is not calling for heater operation, and the sampled test voltage value is above the second threshold parameter determined by the second reference voltage value (processor block 192), no failure conditions are present in heater 106.

FIG. 3 shows a third embodiment of the heater monitoring apparatus 2'. This embodiment is substantially identical to the embodiment of FIG. 1 except that the current monitoring circuitry 130' includes a button switch 144 for manually recording the normal operating current in the EEPROM. Button switch 144 is a normally open push button switch which is connected to a third input on microprocessor 40'. The operational program used by the microprocessor allows the reference voltage values to be recorded manually by a user during normal heater operations, rather than being record automatically at the time heater failure monitoring apparatus 120 is powered up in heater system 102. The addition of the button switch allows, a user to manually verify the operation of the heaters and in the case of self limiting heater cable, operate the heaters for some period of time before the normal operating voltage is recorded in the EEPROM. When button switch 144 is depressed, the startup subroutine is executed and the reference voltages are recorded in EEPROM 142'.

In accordance with the preceding description of the preferred embodiments, one skilled in the art will note several practical advantages of the heater failure monitoring apparatus of this invention. For example, the heater failure monitoring apparatus of this invention can continuously monitors a controlled resistive load for open circuit failures without applying an operational current flow through the load and without significant power consumption during periods when the load is not operational. In addition, the heater failure monitoring apparatus is capable of more accurately identifying failure conditions within the heater by using two electronically stored reference values corresponding to the normal current flow through the heater during non-failure condition operations, both when the heater is active and inactive. The use of the electronically stored reference values also provides the heater failure monitoring apparatus the capability of compensating for fluctuations in line current by increasing the threshold parameters.

It is understood that the above description does not limit the invention to the details given, but may be modified within the scope of the following claims.

I claim:

1. In a controlled electrical resistance heater system including, a resistance heater and a thermostat controller for controlling the operation of said heater and has a switching means for selectively switching between an open and closed condition to control a current flow through said heater thereby controlling the operation of said heater, a heater failure monitoring apparatus for continuously monitoring said heater without applying an operational current flow through said heater to indicate open circuit failures, said heater failure monitoring circuit comprising:

means connectable in parallel with said switching means between said voltage source and said heater for limiting the current flow from said voltage source through said heater when said switch means is in said open condition, means connectable in series with said heater for continuously monitoring current flow through said heater to determine and indicate open circuit failure in said heater, said current monitoring means includes means for generating a first and second initial reference values, said first reference value corresponding to the current flow through said heater when said switch means is in said closed condition and no open circuit failure condition is present, said second reference value corresponding to the current flow through said heater when said switch means is in said open condition and no open circuit failure condition is present, means for electrically storing said first and second reference values, means for continuously generating a test value corresponding to the present current flow through said heater, means responsive to said switch means and said test value generating means for comparing said test value to said first reference value when said switch means is in said closed condition and to said second reference value when said switch means is in said open condition, and for generating an output signal when said test value is less than said first or second reference values, and alarm means responsive to said output signal for indicating an open circuit failure condition in said heater.

2. The apparatus of claim 1 wherein said comparing means generate said output signal when said test value is less than said first or second reference values by a predetermined parameter.

3. The apparatus of claim 1 wherein said current limiting means has a reactance such that said current flow through said heater is in quadrature with the excitation voltage from said voltage source.

4. The apparatus of claim 1 wherein said current limiting means is a capacitor.

5. The apparatus of claim 1 wherein said reference values generating means includes means for converting the current flow through said heater into a first reference voltage signal when no failure condition is present in said heater and when said switch means is in said closed condition and for converting the current flow through said heater into a second reference voltage signal when no failure conditions is present in said heater and when said switch means is in said open condition, and means for converting said first and second reference voltage signals into a first and second reference binary value.

6. The apparatus of claim 1 wherein said reference values storing means includes electrically erasable programmable read only memory.

7. The apparatus of claim 1 wherein said test value generating means includes means for converting the current flow through said heater into a test voltage signal, means for converting said test voltage signal into a binary test value.

8. The apparatus of claim 1 wherein said comparing means is a microprocessor.

9. A method for continuously monitoring a controlled resistive load without applying an operational current flow through said load to indicate open circuit failures, said method comprising in combination the steps of:

a) generating first and second reference values, said first reference corresponding to the current flow through said load when said switching means is in a closed condition and a failure condition is not present, said second reference corresponding to the current flow through said load when said switching means is in an open condition and a failure condition is not present a) electrically storing said first and second reference values, b) generating a test value corresponding to the present current flow through said load, c) determining whether said load is active or inactive, d) comparing said test value to said first reference value when said load is active and comparing said test value to said second reference value when said load is inactive, e) generating an output signal to indicate a failure condition when said test value is below said first or second reference values.

10. The method of claim 9 wherein step e) further includes generating an output signal to indicate a failure condition when said test value is below said first or second reference values by a predetermined parameter.

* * * * *